(12) United States Patent
Yokoyama et al.

(10) Patent No.: US 6,933,249 B2
(45) Date of Patent: Aug. 23, 2005

(54) METHOD OF FABRICATING SEMICONDUCTOR DEVICE

(75) Inventors: Shin Yokoyama, Higashi-Hiroshima (JP); Anri Nakajima, Higashi-Hiroshima (JP); Yoshihide Tada, Nirasaki (JP); Genji Nakamura, Nirasaki (JP); Masayuki Imai, Annaka (JP); Tsukasa Yonekawa, Nirasaki (JP)

(73) Assignee: Tokyo Electron Limited (JP)

( * ) Notice: Subject to any disclaimer, the term of this patent is extended or adjusted under 35 U.S.C. 154(b) by 82 days.

(21) Appl. No.: 10/479,043

(22) PCT Filed: May 31, 2002

(86) PCT No.: PCT/JP02/05386

§ 371 (c)(1),
(2), (4) Date: Nov. 26, 2003

(87) PCT Pub. No.: WO02/099868

PCT Pub. Date: Dec. 12, 2002

(65) Prior Publication Data

US 2004/0152339 A1 Aug. 5, 2004

(30) Foreign Application Priority Data

Jun. 4, 2001 (JP) ........................................ 2001-168789

(51) Int. Cl.[7] .............................................. H01L 21/31
(52) U.S. Cl. ........................ 438/786; 438/791; 438/909
(58) Field of Search ................................. 438/762, 763, 438/786, 791, 909

(56) References Cited

U.S. PATENT DOCUMENTS

| 5,107,308 | A | * | 4/1992 | Koezuka et al. | 257/40 |
| 6,165,916 | A | * | 12/2000 | Muraoka et al. | 438/791 |
| 6,333,547 | B1 | * | 12/2001 | Tanaka et al. | 257/649 |
| 2001/0007244 | A1 | | 7/2001 | Matsuse | |
| 2002/0024118 | A1 | | 2/2002 | Katsuaki et al. | |

FOREIGN PATENT DOCUMENTS

| EP | 0 015 390 A1 | 9/1980 |
| EP | 0 259 777 A2 | 3/1988 |
| JP | 09-050996 A | 2/1997 |

* cited by examiner

Primary Examiner—Chandra Chaudhari
(74) Attorney, Agent, or Firm—Finnegan, Henderson, Farabow, Garrett & Dunner, LLP

(57) ABSTRACT

A manufacturing method for semiconductor devices that can improve uniformity in the surface of a silicon nitride film or a nitride film to be formed and improve production efficiency is provided. A step of forming a first film that is a silicon oxide film or a silicon oxynitride film on a silicon substrate, a step of forming a second film that is a tetrachlorosilane monomolecular layer, and a step of forming a third film that is a silicon nitride monomolecular layer by performing a nitriding process on the second film are included. A silicon nitride film having a predetermined film thickness is formed by repeating the step of forming the second film and the step of forming the third film for a predetermined number of times. In a manufacturing apparatus, a plurality of silicon substrates are arranged on a stair-like wafer boat, and a process gas is supplied toward the upper side of a reaction tube from a process gas supply pipe.

9 Claims, 3 Drawing Sheets

FIG.3

METHOD OF FABRICATING SEMICONDUCTOR DEVICE

TECHNICAL FIELD

The present invention relates to manufacturing methods for semiconductor devices, and more particularly, to a forming method of a silicon nitride film or a silicon oxynitride film and an annealing method therefor.

BACKGROUND ART

Silicon thermal oxide films are used as gate insulating films of MOSFETs for memory, capacitor insulating films of DRAMs, and the like. With the recent and continuing increase in the integration degree of semiconductor devices, it is necessary to reduce the area occupied by a MOSFET and the like. For that purpose, it is required to reduce the film thickness of a silicon thermal oxide film so as to maintain a constant capacitance. In addition, due to scaling arising from miniaturization of devices, nowadays it is required to reduce the film thickness of the thermal oxide film to several dozen Å. Further, the same applies to the case of forming a thermal oxynitride film instead of a thermal oxide film.

Such reduction of the thickness of a silicon thermal oxide film or a thermal oxynitride film causes a direct increase of the tunnel current. Hence, there are problems in that circuits of semiconductor devices do not operate normally or power consumption is increased since a leakage current is produced.

Consequently, a silicon nitride film or an oxynitride film, having a dense structure, is considered as a good insulating film as an alternative to a silicon thermal oxide film or a thermal oxynitride film.

Such silicon nitride film or oxynitride film is formed by nitriding or oxynitriding a silicon thermal oxide film or a thermal oxynitride film. Then, by achieving a capacitance with a relatively great dielectric constant of the nitride film or the oxynitride film, it is possible to increase the film thickness (physical film thickness) of a nitride film or an oxynitride film having the constant capacitance as that of a silicon thermal oxide film that maintains a constant capacitance. Thereby, reduction of the leakage current is achieved. Hereinafter, in this description, the thickness of a silicon nitride film or an oxynitride film converted to the thickness of a silicon thermal oxide film that gives an equivalent capacitance is referred to as an electric film thickness.

Incidentally, in the silicon nitride film or the oxynitride film formed as mentioned above, it is not necessarily easy to control the film thickness and the uniformity within the surface of the film with accuracy.

For this reason, a method is considered in which, by using the ALD (Atomic Layer Deposit)-CVD method, an operation of forming a monatomic layer or a monomolecular layer of a silicon nitride or an oxynitride is repeated to deposit a plurality of monatomic layers or monomolecular layers, thereby forming a film of a predetermined thickness.

However, generally, the method using the ALD-CVD method, which is considered currently, requires about several dozen minutes, for example, to form one monatomic layer or monomolecular layer. Additionally, in order to form the predetermined thickness, it is necessary to repeat the operation of forming a monatomic layer or a monomolecular layer several dozen times. Hence, there is a problem in that production efficiency is significantly lowered.

A specific example of the ALD-CVD method will be described.

First, a silicon substrate is subjected to thermal processing in a nitrous oxide gas, thereby forming a silicon oxide film having a film thickness of 12 Å (angstrom) on the silicon substrate. Then, a process is performed at the temperature of approximately 400° C. by using TCS (tetrachlorosilane) as a process gas, and one monomolecular layer of TCS is formed through adsorption. Thereafter, the monomolecular layer of tetrachlorosilane is processed at the temperature of approximately 550° C. by using ammonia gas as a process gas so as to form one monomolecular layer of a silicon nitride (nitride of silicon). Then, in order to obtain the film thickness of, for example, 15–20 Å, the forming operation of the monomolecular layer of the silicon nitride is repeated for, for example, twenty times.

It is reported that the uniformity within the surface of a film is significantly improved according to the above-mentioned ALD-CVD method.

DISCLOSURE OF THE INVENTION

It is a first object of the present invention to provide a manufacturing method for semiconductor devices which method can improve the uniformity within the surface of a silicon nitride film or an oxynitride film to be formed and can improve production efficiency at that time.

A second object of the present invention is to provide a manufacturing method for a semiconductor device that includes an annealing method, and can further reduce a leakage current and mitigate shift of a flat band voltage when a silicon nitride film or a silicon oxynitride film to be formed is used as an insulating film in a MOS capacitor and the like.

In order to achieve the objects, a manufacturing method for semiconductor devices according to the present invention includes the steps of: forming a first film that is one of a silicon oxide film and a silicon oxynitride film on a silicon substrate by one of thermal oxidation and thermal oxynitridation; forming a second film that is a tetrachlorosilane monomolecular layer on the first film by performing a process by using a tetrachlorosilane gas at a predetermined temperature; and forming a third film that is a silicon nitride monomolecular layer by performing a nitriding process on the second film by using an ammonia gas at a temperature substantially the same as the temperature in the step of forming the second film, wherein a silicon nitride film having a predetermined film thickness is formed by repeating the step of forming the second film and the step of forming the third film for a predetermined number of times.

Here, substantially the same temperature refers to a temperature within the range of ±25° C.

In this case, in the step of forming the second film and the step of forming the third film, it is preferable for the predetermined temperature to be within the range of 375–650° C., and the processing pressure to be 10–100 kPa. Additionally, in the step of forming the second film, it is preferable for the process to be performed by using the tetrachlorosilane gas at the flow rate of 100–300 sccm for 1–20 minutes. In addition, in the step of forming the third film, it is preferable for the process to be performed by using ammonia gas at the flow rate of 1000–3000 sccm for 1–10 minutes. Further, it is preferable for the step of forming the second film and the step of forming the third film to be repeated for 3–20 times.

With the above-mentioned features of the present invention, compared to a film formed by a conventional CVD method, it is possible to significantly improve uniformity in the surface of a film. Also, compared to a conventional ALD-CVD method, it is possible to further improve it.

Further, since the step of forming the second film and the step of forming the third film are performed at substantially the same temperature, a time interval for varying a temperature condition, which is necessary in the conventional ALD-CVD method, is no longer required. Thus, it is possible to significantly improve production efficiency.

In addition, in this case, after forming the silicon nitride film having the predetermined film thickness, if there is a further step of annealing in an ozone atmosphere, shift of the flat band voltage is mitigated since a positive fixed electric charge of the silicon oxide film or the silicon oxynitride film is reduced by the radical oxygen of ozone. Also, a leakage current is reduced by modification effects of a silicon nitride film caused by the radical oxygen.

Additionally, a manufacturing method for semiconductor devices according to the present invention includes the steps of: forming a first film that is one of a silicon oxide film and a silicon oxynitride film by one of thermal oxidation and thermal oxynitridation on a silicon substrate; forming a second film that is a tetrachlorosilane monomolecular layer on the first film by performing a process using tetrachlorosilane gas at a predetermined temperature; forming a third film that is a silicon nitride monomolecular layer by performing a nitriding process on the second film by using ammonia gas at a temperature substantially the same as the temperature in the step of forming the second film; and forming a fourth film that is a silicon nitride film on the third film by a CVD method.

Hence, without repeating the step of forming the second film and the step of forming the third film for the predetermined number of times, the fourth film is formed by using the CVD method after forming a single third layer. Therefore, it is possible to significantly improve production efficiency while maintaining uniformity in the surface of a film to be formed.

Further, a manufacturing method for semiconductor devices according to the present invention includes the steps of: forming a first film that is one of a silicon oxide film and a silicon oxynitride film by one of thermal oxidation or thermal oxynitridation on a silicon substrate; forming a second film that is a tetrachlorosilane monomolecular layer on the first film by performing a process by using tetrachlorosilane gas at a predetermined temperature; forming a third film that is a silicon nitride monomolecular layer by performing a nitriding process on the second film by using ammonia gas at a temperature substantially the same as the temperature in the step of forming the second film; and annealing in an ozone gas atmosphere, wherein a silicon nitride film having a predetermined film thickness is formed by repeating the step of forming the second film, the step of forming the third film, and the step of annealing for a predetermined number of times.

Hence, it is possible to achieve annealing effects similar to those mentioned above.

BRIEF DESCRIPTION OF THE DRAWINGS

FIG. 3 is a graph for explaining characteristics evaluation results obtained when the silicon nitride film formed by the manufacturing apparatus and the manufacturing method for semiconductor devices according to the present embodiments is used as the insulating film of an nMOS capacitor, and represents evaluation results of a flat band voltage.

BEST MODE FOR CARRYING OUT THE INVENTION

Figure 1:
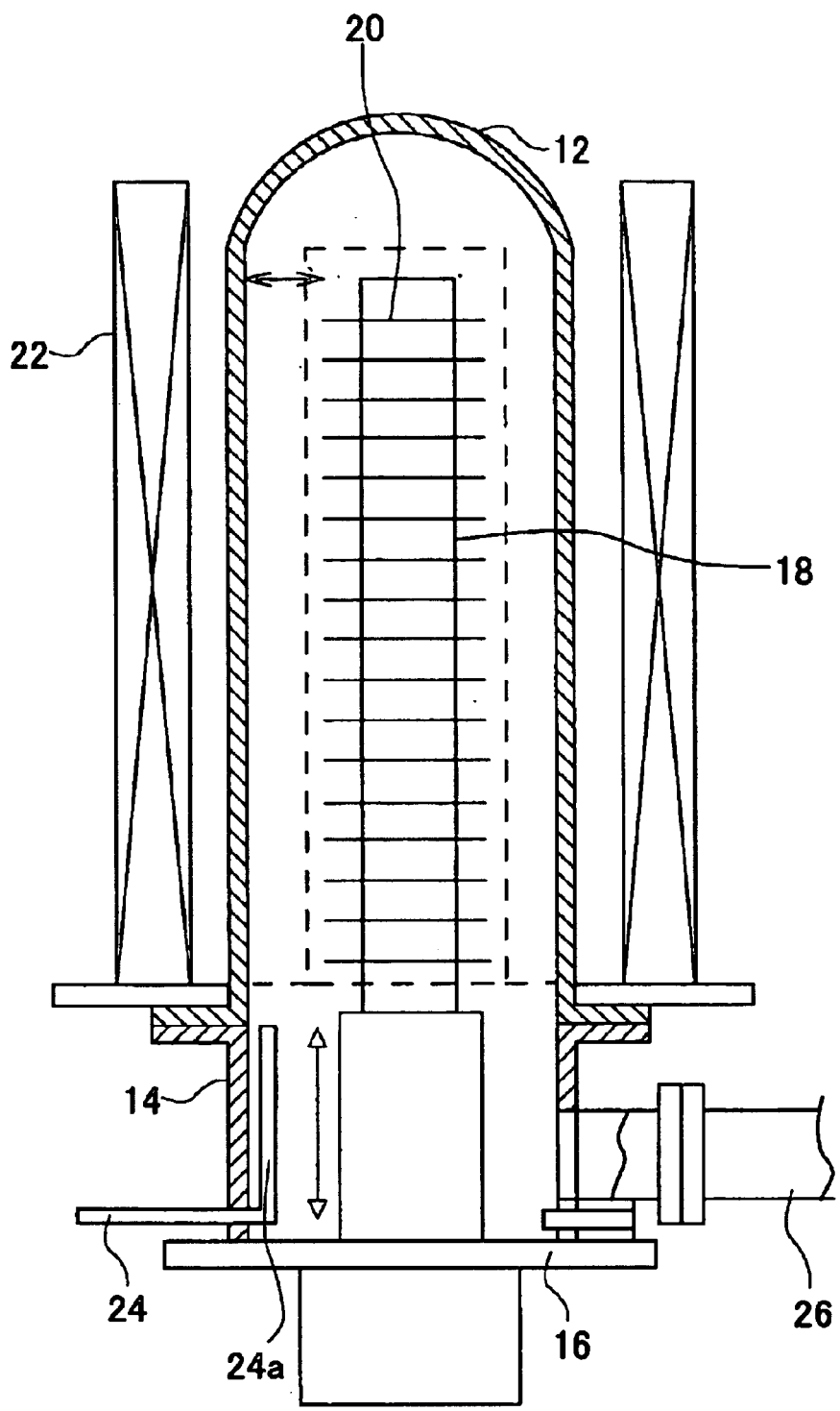
FIG. 1 is a diagram of a manufacturing apparatus for semiconductor devices according to the present embodiments.

Referring to the drawings, a description will be given below of preferred embodiments (hereinafter referred to as present embodiments) of the manufacturing methods for semiconductor devices according to the present invention.

First, referring to FIG. 1, a manufacturing apparatus for semiconductor devices according to the present embodiments will be described.

A manufacturing apparatus 10 shown in FIG. 1 is a kind of FTPS (Fast Thermal Processing System).

The manufacturing apparatus 10 is provided with a reaction tube 12 made of quartz, for example, and formed into a cylindrical shape with a ceiling, the longitudinal direction of the cylindrical shape being directed to a vertical direction. A manifold 14 that is a stainless-steel tube formed into a tube-like shape is arranged underneath the reaction tube 12 such that the manifold 14 and the bottom of the reaction tube 12 make contact in an airtight manner. A cover 16 is arranged underneath the manifold 14 such that the cover 16 can move up and down. The bottom of the manifold 14 is closed when the cover 16 moves up.

A process chamber is constituted by the reaction tube 12, the manifold 14, and the cover 16.

A ladder-like wafer boat 18 formed by quartz is arranged on the cover 16. The wafer boat 18 accommodates a plurality of silicon substrates 20 at predetermined intervals in the vertical direction.

A warming heater 22 formed by a resistance heating element, for example, is provided around the reaction tube 12.

A process gas supply pipe 24 is provided through a side surface of the manifold 14. The process gas supply pipe 24 is bent such that a top portion 24a thereof turns up. Hence, process gas supplied from the process gas supply pipe 24 is emitted upward. In addition, reference numeral 26 denotes an exhaust pipe.

Since the above-mentioned manufacturing apparatus 10 is configured such that the process gas reaches the upper side of the reaction tube, the process gas is supplied at high speed and at a large flow rate. Additionally, being configured such that the process gas reaches the ceiling of the reaction tube, and the reaction tube is provided with a predetermined air gap, for example, the process gas is supplied evenly in a process region and the silicon substrates are processed equally.

A description will be given of the manufacturing method for semiconductor devices using the above-mentioned manufacturing apparatus 10 according to a first embodiment of the present embodiments.

The manufacturing method of semiconductor devices according to the first embodiment of the present embodiments includes a step of forming a first film that is a silicon oxide film or a silicon oxynitride film on a silicon substrate by thermal oxidation or thermal oxynitridation, a step of forming a second film that is a tetrachlorosilane monomolecular layer on the first film by processing the first film by using tetrachlorosilane gas at a predetermined temperature, and a step of forming a third film that is a silicon nitride monomolecular layer by nitriding the second film by using ammonia gas at a temperature substantially the same as that in the step of forming the second film. A silicon nitride film having a predetermined film thickness is formed by repeating the step of forming the second film and the processing of forming the third film for a predetermined number of times.

A further detailed description will be given of the manufacturing method according to the first embodiment of the present embodiments.

First, a thermal oxynitride film (the first film) having a film thickness of 12 Å is formed on a silicon substrate by processing the substrate in a dinitrogen monoxide gas atmosphere at 700° C. for 15 minutes.

Next, in the step of forming the second film, tetrachlorosilane gas is supplied at the flow rate of approximately 200 sccm, and the substrate is processed for about 15 minutes under the processing pressure of 21 kPa, for example, and at the predetermined temperature of 550° C., for example. Thereby, the tetrachlorosilane monomolecular layer (the second layer) is formed on the thermal oxynitride film.

Then, the process chamber is evacuated, or the tetrachlorosilane gas remaining in the process chamber is purged by using a nitrogen gas. The time required for purging and fine adjustment of temperature variation and the like in the purging is approximately four minutes, for example.

Thereafter, in the step of forming the third film, ammonia gas is supplied at the flow rate of approximately 2000 sccm, and the tetrachlorosilane monomolecular layer is processed under the processing pressure of 21 kPa, for example, and at the predetermined temperature of 550° C., for example, which is the same temperature as that in the step of forming the second film, for approximately 5 minutes. Thereby, the silicon nitride monomolecular layer (the third film) is formed.

By repeating the step of forming the second film and the step of forming the third film for 10 times, for example, respective monomolecular layers are accumulated, and thus a silicon nitride film (nitrogenized silicon film) having a film thickness of 10 Å is formed.

The time required for the silicon nitride film formation operation according to the manufacturing method of the first embodiment of the present embodiments is 240 minutes $\{=(15+4+5)\times 10\}$.

The total film thickness of the thermal oxynitride film and the silicon nitride film formed on the silicon substrates arranged in the upper side of the manufacturing apparatus 10 is 2.11 nm at the maximum, 2.05 nm at the minimum, and 2.08 nm on the average. On the other hand, the total film thickness of the thermal oxynitride film and the silicon nitride film formed on the silicon substrates arranged in the lower side of the manufacturing apparatus 10 is 2.30 nm at the maximum, 2.21 nm at the minimum, and 2.26 nm on the average. Accordingly, uniformity within the films formed by the thermal oxynitride film and the silicon nitride film is very high in each of the substrates, the substrates being arranged in the upper side of the manufacturing apparatus and in the lower side thereof.

Next, a description will be given below of the manufacturing method for semiconductor devices according to a second embodiment of the present embodiments.

The manufacturing method for semiconductor devices according to the second embodiment of the present embodiments further anneals the silicon nitride film obtained by the manufacturing method for semiconductor devices according to the first embodiment of the present embodiments.

That is, the step of further annealing, in an ozone gas atmosphere, the silicon nitride film that is formed to have a predetermined film thickness by repeating the step of forming the second film and the step of forming the third film for a predetermined number of times is included.

Ozone gas having the volume ratio of approximately $O_3/O_2=10/90$ (volume % ratio) is used, and the process is performed under the pressure of approximately 18 Pa and at the temperature of approximately 850° C. for approximately 60 seconds.

Figure 2:
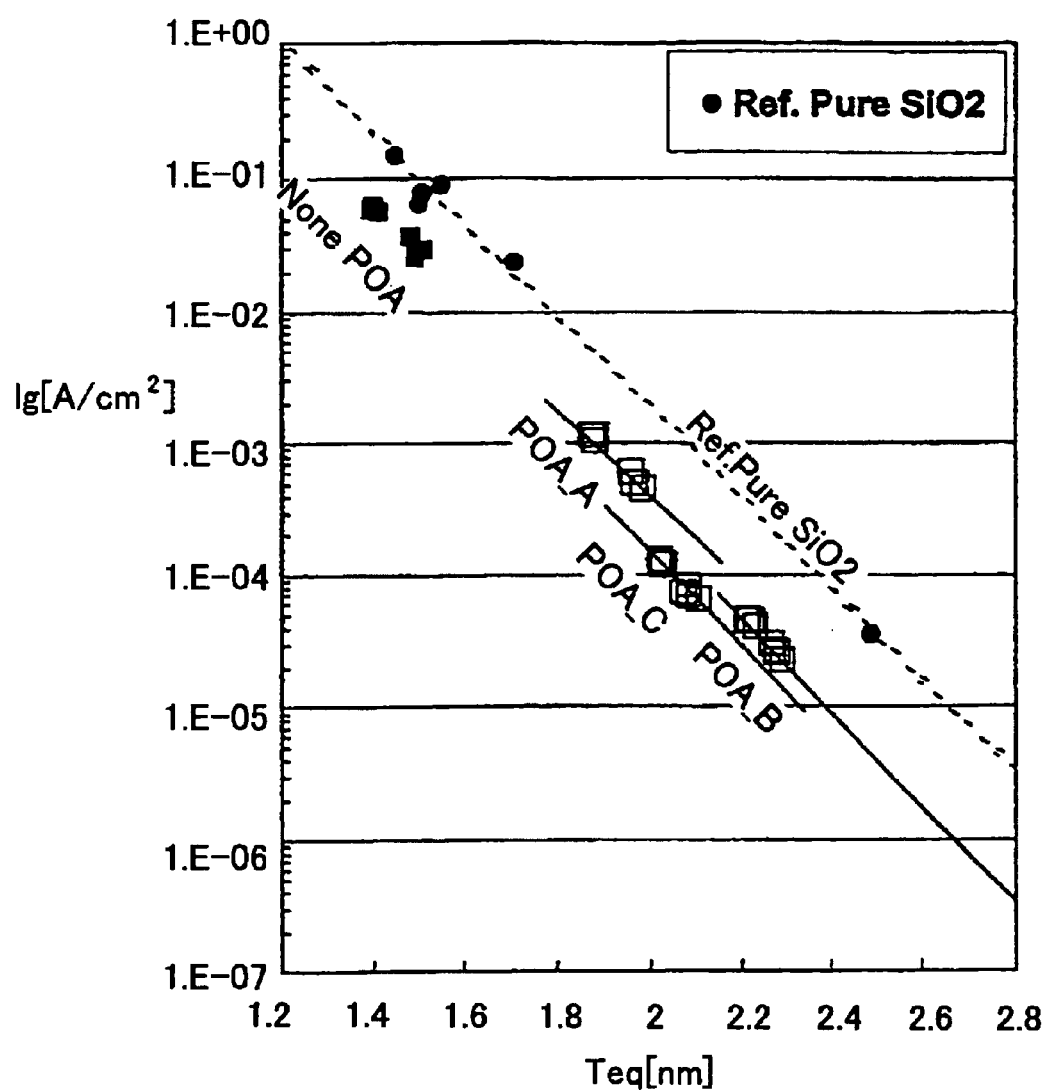
FIG. 2 is a graph for explaining characteristics evaluation results obtained when a silicon nitride film formed by a manufacturing apparatus and a manufacturing method for semiconductor devices according to the present embodiments is used as an insulating film of an nMOS capacitor, and represents evaluation results of a leakage current.
Figure 3:
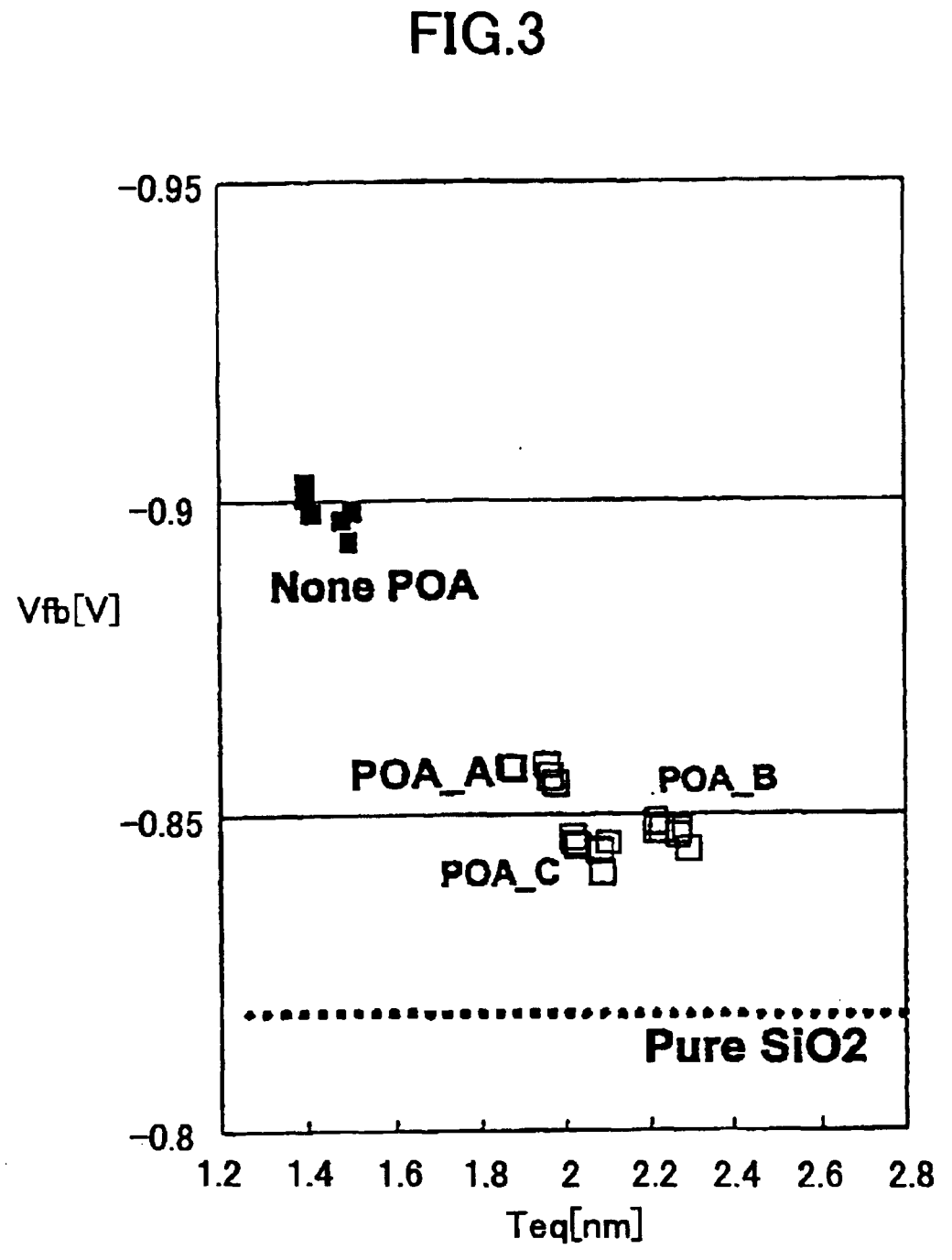

FIGS. 2 and 3 show characteristic evaluation results of the case where the silicon nitride film formed according to the above-mentioned method is used as an insulating film of an nMOS capacitor.

FIG. 2 shows evaluation results of a leakage current of a gate. The vertical axis (Ig) represents the leakage current at the time when the flat band voltage is accumulated for −0.6V, and the horizontal axis (Teq) represents the electric film thickness.

In the figure, POA-C indicates the case where the annealing process is performed after performing the silicon nitride film formation process. In addition, in the figure, Ref. Pure SiO2 indicates the case of the silicon oxide film. None-POA indicates the case where only the silicon nitride film formation process is performed and no annealing process is performed. POA-A indicates the case where the annealing process is performed at the temperature of 1000° C. in an oxygen gas atmosphere after performing the silicon nitride film formation process. POA-B indicates the case where the annealing is performed at the temperature of 850° C. in a dinitrogen monoxide gas atmosphere after performing the silicon nitride film formation process.

As is clear from FIG. 2, compared to conventional silicon nitride films, the silicon nitride film of the first embodiment of the present embodiments subjected to the conventional annealing process using oxygen gas or dinitrogen monoxide gas shows leakage current reduction effects by the silicon nitride film formation process. However, compared to the case where the annealing process is not performed on the silicon nitride film of the first embodiment of the present embodiments, no significant effect is observed. On the other hand, in the silicon nitride film of the second embodiment of the present embodiments in which the annealing process is performed thereon, in addition to the leakage current reduction effects obtained by the silicon nitride film formation process, the leakage current reduction effects are further obtained by the annealing process.

FIG. 3 shows evaluation results of the flat band voltage. Here, the vertical axis (Vfb) represents the flat band voltage, and the horizontal axis (Teq) represents the electric film thickness. In the figure, each of the symbols such as POA-A denotes the same as that in FIG. 2.

As is clear from FIG. 3, in the case where there is no annealing process but the silicon nitride film formation process is performed, compared to the case of the silicon oxide film, the phenomenon is observed in which the absolute value of the flat band voltage is greatly increased. On the other hand, in the cases where a conventional annealing process using oxygen gas or dinitrogen monoxide gas is performed and where the annealing process according to the second embodiment of the present embodiments is performed, increase in the absolute value of the flat band voltage is well suppressed.

As mentioned above, with the manufacturing method for semiconductor devices and the apparatus according to the second embodiment of the present embodiments, it is possible to further reduce the leakage current and to relax the shift of the flat band voltage.

In addition, the manufacturing method for semiconductor devices according to the first embodiment of the present embodiments includes, as mentioned above, the step of forming the second film that is a tetrachlorosilane monomolecular layer on the first film by performing the process by using tetrachlorosilane gas at the predetermined temperature, and the step of forming the third film that is the silicon nitride film monomolecular layer by performing a nitriding process on the second film by using ammonia gas at a temperature substantially the same as that in the step of forming the second film. The silicon nitride film having the predetermined film thickness is formed by repeating the step of forming the second film and the step of forming the third film for the predetermined number of times. More preferably, the formed silicon nitride film is subjected to the annealing process. However, alternatively, the following method may be used in the manufacturing method of the present invention.

That is, after forming the second film that is the tetrachlorosilane monomolecular layer on the first film by performing the process by using tetrachlorosilane gas at the predetermined temperature, the third film that is the silicon nitride film is formed by performing the nitriding process on the second film by using ammonia gas at a temperature substantially the same as that in the step of forming the second film. Further, a fourth film that is a silicon nitride film is formed on the third film by the CVD method.

Additionally, when annealing is performed, after forming the second film that is the tetrachlorosilane monomolecular layer on the first film by performing the process by using tetrachlorosilane gas at the predetermined temperature, the third film that is the silicon nitride monomolecular layer is formed by performing the nitriding process on the second film by using ammonia gas at a temperature substantially the same as that in the step of forming the second film, and further, annealing is performed in an ozone gas atmosphere. Then, a silicon nitride film having the predetermined film thickness is formed by repeating the step of forming the second film, the step of forming the third film, and the step of performing annealing for a predetermined number of times.

In addition, the vertical type FTPS, which is capable of processing a large number of silicon substrates as mentioned above, is used as the manufacturing apparatus used in the manufacturing method for semiconductor devices according to the present embodiments. However, this is not a limitation, and a single-substrate system may also be used.

What is claimed is:

1. A manufacturing method for semiconductor devices, comprising the steps of:
    forming a first film that is one of a silicon oxide film and a silicon oxynitride film on a silicon substrate by one of thermal oxidation and thermal oxynitridation;
    forming a second film that is a tetrachlorosilane monomolecular layer on the first film by performing a process by using a tetrachlorosilane gas at a predetermined temperature; and
    forming a third film that is a silicon nitride monomolecular layer by performing a nitriding process on the second film by using an ammonia gas at a temperature substantially the same as the temperature in the step of forming the second film,
    wherein a silicon nitride film having a predetermined film thickness is formed by repeating the step of forming the second film and the step of forming the third film for a predetermined number of times.

2. The manufacturing method for semiconductor devices as claimed in claim 1, wherein, in the step of forming the second film and the step of forming the third film, the predetermined temperature is within a range of 375–650° C., and a processing pressure is 10–100 kPa.

3. The manufacturing method for semiconductor devices as claimed in claim 1, wherein, in the step of forming the second film, the process is performed by using the tetrachlorosilane gas at a flow rate of 100–300 sccm for 1–20 minutes.

4. The manufacturing method for semiconductor devices as claimed in claim 1, wherein, in the step of forming the third film, the process is performed by using the ammonia gas at a flow rate of 1000–3000 sccm for 1–10 minutes.

5. The manufacturing method for semiconductor devices as claimed in claim 1, wherein the step of forming the second film and the step of forming the third film are repeated for 3–20 times.

6. The manufacturing method for semiconductor devices as claimed in claim 1,
    wherein, in the step of forming the second film and the step of forming the third film, the predetermined temperature is within a range of 375–650° C. and a processing pressure is 10–100 kPa,
    wherein, in the step of forming the second film, the process is performed by using the tetrachlorosilane gas at a flow rate of 100–300 sccm for 1–20 minutes,
    wherein, in the step of forming the third film, the process is performed by using the ammonia gas at a flow rate of 1000–3000 sccm for 1–10 minutes, and
    wherein the step of forming the second film and the step of forming the third film are repeated for 3–20 times.

7. The manufacturing method for semiconductor devices as claimed in claim 1, further comprising the step of:
    annealing in an ozone gas atmosphere after forming the silicon nitride film having the predetermined film thickness.

8. A manufacturing method for semiconductor devices, comprising the steps of:
    forming a first film that is one of a silicon oxide film and a silicon oxynitride film by one of thermal oxidation and thermal oxynitridation on a silicon substrate;
    forming a second film that is a tetrachlorosilane monomolecular layer on the first film by performing a process by using a tetrachlorosilane gas at a predetermined temperature;
    forming a third film that is a silicon nitride monomolecular layer by performing a nitriding process on the second film by using an ammonia gas at a temperature substantially the same as the temperature in the step of forming the second film; and
    forming a fourth film that is a silicon nitride film on the third film by a CVD method.

9. A manufacturing method for semiconductor devices, comprising the steps of:
    forming a first film that is one of a silicon oxide film and a silicon oxynitride film by one of thermal oxidation or thermal oxynitridation on a silicon substrate;
    forming a second film that is a tetrachlorosilane monomolecular layer on the first film by performing a process by using a tetrachlorosilane gas at a predetermined temperature;
    forming a third film that is a silicon nitride monomolecular layer by performing a nitriding process on the second film by using an ammonia gas at a temperature substantially the same as the temperature in the step of forming the second film; and
    annealing in an ozone gas atmosphere,
    wherein a silicon nitride film having a predetermined film thickness is formed by repeating the step of forming the second film, the step of forming the third film, and the step of annealing for a predetermined number of times.

* * * * *